United States Patent [19]

Schomburg et al.

[11] 4,024,402
[45] May 17, 1977

[54] SPECIMEN CARTRIDGE FOR A PARTICLE BEAM DEVICE

[75] Inventors: Wilhelm Schomburg; Horst Schmidt, both of Berlin, Germany

[73] Assignee: Siemens Aktiengesellschaft, Berlin & Munich, Germany

[22] Filed: Sept. 9, 1975

[21] Appl. No.: 611,644

Related U.S. Application Data

[63] Continuation of Ser. No. 176,879, Sept. 1, 1971, abandoned.

[30] Foreign Application Priority Data

Sept. 18, 1970 Germany .......................... 2047100

[52] U.S. Cl. ............................................. 250/442
[51] Int. Cl.² ........................................ G21K 5/06
[58] Field of Search .......... 250/441, 442, 440, 311, 250/310

[56] References Cited

UNITED STATES PATENTS

| | | | |
|---|---|---|---|
| 3,086,112 | 4/1963 | Riecke | 250/442 |
| 3,240,934 | 3/1966 | Watanbe et al. | 250/442 |
| 3,342,992 | 9/1967 | Schmidt et al. | 250/441 |
| 3,426,193 | 2/1969 | Guernet | 250/442 |
| 3,435,210 | 3/1969 | Valdre | 250/442 |
| 3,586,855 | 6/1971 | Fuchs | 250/442 |
| 3,628,013 | 12/1971 | Heide | 250/442 |

*Primary Examiner*—Alfred E. Smith
*Assistant Examiner*—B. C. Anderson
*Attorney, Agent, or Firm*—Herbert L. Lerner

[57] ABSTRACT

A specimen cartridge is provided for a particle beam device, such as an electron microscope or the like equipped with a specimen table adjustable transverse to the beam axis, the cartridge being insertable into the table along an axis parallel to the beam axis. The cartridge has a conical member having a longitudinal axis and a specimen holder having a plurality of openings for receiving a corresponding number of specimens is secured to the conical member. The holder is rotatable about an axis of rotation eccentric to the longitudinal axis of the conical member.

7 Claims, 6 Drawing Figures

SPECIMEN CARTRIDGE FOR A PARTICLE BEAM DEVICE

This is a continuation, of application Ser. No. 176,879, filed Sept. 1, 1971 abandoned.

Our invention relates to specimen cartridges for particle beam devices, such as electron microscopes or the like. To bring specimens into the interior of a particle beam device, specimen cartridges are used. Specimen cartridges include a conical member with which the specimen cartridge is insertable into the specimen table of the microscope in a direction parallel to the axis of the particle beam.

The specimen table is transversely adjustable in the interior of the electron microscope relative to a table carrier, to permit various surface regions of the inserted specimen to be investigated. The table carrier can, for example,s be made from the pole shoe to the magnetic objective lens of an electron beam microscope. The specimen cartridge often includes a specimen holder for receiving the specimen to be investigated. This specimen received by the specimen holder is readily exchangeable for other specimens.

Each specimen to be investigated is first secured by means of the specimen holder and then, with the conical member, is placed into the microscope through an air lock, the microscope being connected with an operating pump. After this preparatory step, the specimen regions of interest are investigated. In many cases, it is desired to compare the specimen under investigation with other specimens. In this connection, difficulties arise because of the necessary preparation associated with insertion of the specimen or comparison specimens into the microscope.

It is an object of our invention to provide a specimen cartridge for a particle beam apparatus, such as an electron microscope or the like. Subsidiary to this object, it is an object of our invention to provide a specimen cartridge which is insertable into a transversely adjustable specimen table along an axis parallel to the beam axis.

The specimen cartridge of the invention includes a cartridge cone or conical member, as well as a specimen holder connected to the latter. In this connection, it becomes a further object of our invention to provide a specimen cartridge which permits and facilitates the simultaneous insertion of a plurality of specimens into the interior of the electron microscope, thereby preventing the above-mentioned difficulties.

According to a feature of the invention, the specimen holder of the specimen cartridge is provided with a plurality of openings for receiving specimens and, according to a further feature, the specimen holder is secured to the conical member and is rotatable about an axis of rotation extending eccentric to the longitudinal axis of the conical member.

In applying the specimen cartridge of the invention, it is possible to bring a plurality of specimens simultaneously into the interior of an electron microscope and to place the specimens individually by means of a rotation of the specimen holder into the path of the particle beam. According to a preferred embodiment of the invention, the specimen holder is configured so as to be in the form of a circular disk.

According to another embodiment of the invention, the openings of the circular shaped disk are configured for receiving special specimen carriers. These object carriers are tightly held in place by means of a plate which is tensioned against the disk. These specimen carriers are for example, formed from ring apertures receiving the specimens and have a centric bore for leaving the specimen surfaces to be investigated free.

In an alternate embodiment of the invention, the openings are configured as slits extending concentric to the rotating axis of the disk. With this embodiment, investigations of large surface areas of the specimens is possible.

In an advantageous embodiment of the invention, the specimen holder is joined with a gear wheel via a shaft. The gear wheel is rotatably borne on, the end face of the cartridge cone. by means of the arrangement of the shaft, the specimen holder is directed at a distance from the end face of the cartridge cone. To insure a precise positioning of the specimen holder free of tipping, the gear wheel has a radius which extends beyond the longitudinal axis of the cone, whereby the gear wheel is provided with pass-through openings for the electron beam which correspond to the openings of the circular shaped disk. This embodiment affords the additional advantage that the gear wheel has a correspondingly large diameter to accommodate a large drive arrangement.

The gear wheel is advantageously joined with a pinion positioned on a drive shaft which is directed in the cartridge cone parallel to the longitudinal axis of the cone. This drive shaft has a toothed drive wheel which has a diameter extending beyond the periphery of the cartridge cone. The toothed drive wheel meshes with a corresponding toothed wheel borne in the specimen table. The toothed wheel in the specimen table is driven from outside the electron microscope by means of appropriate linkages. By adjusting these linkages, the specimen holder is turned about an axis extending eccentric to the longitudinal axis of the cartridge cone, thereby permitting the specimens to be sequentially placed in the path of the electron beam.

The invention will now be described with reference to the drawings wherein.

Figure 1:
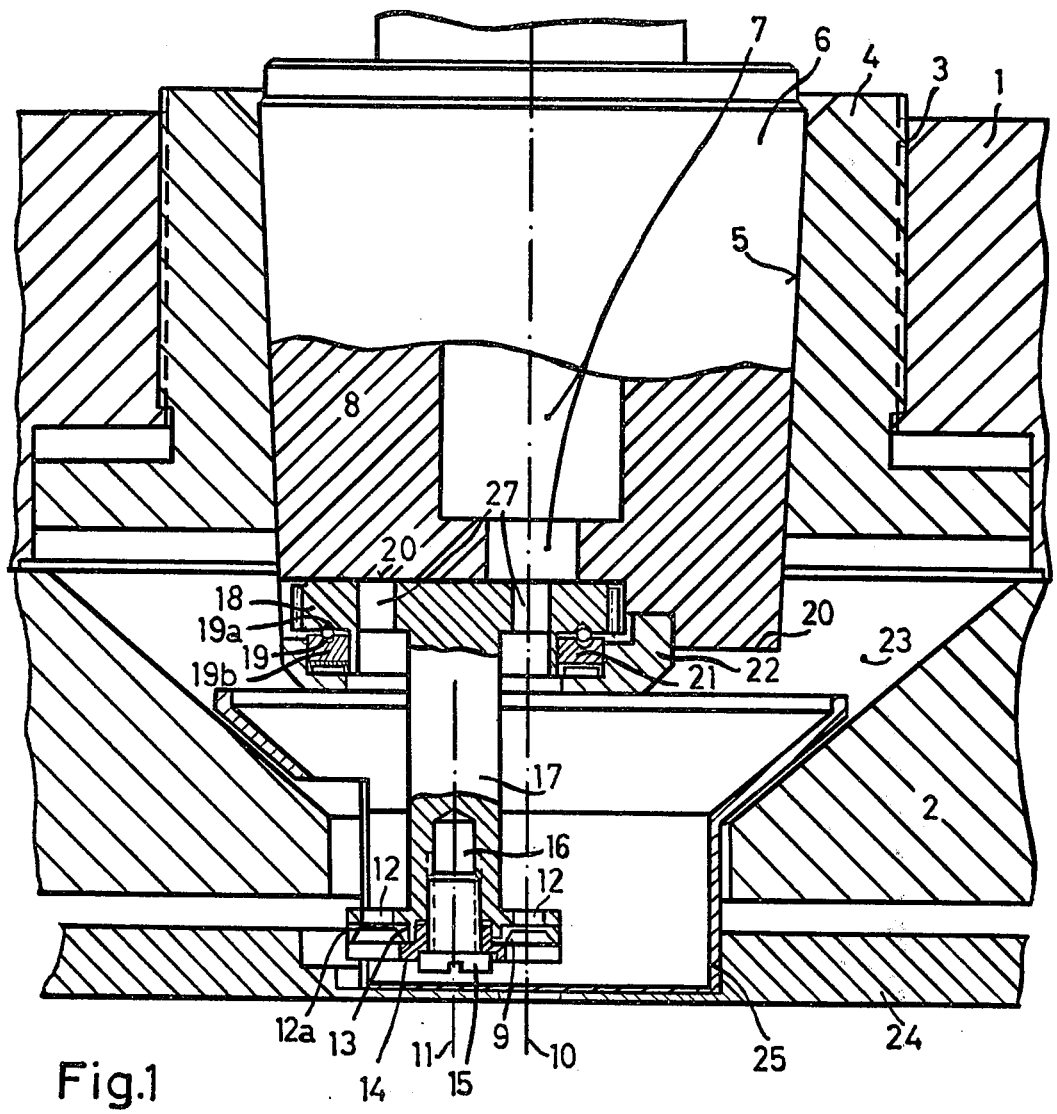
FIG. 1 illustrates a pertinent portion of the interior of an electron microscope provided with a specimen cartridge according to the invention, the latter being illustrated partially in section.

FIG. 1 illustrates schematically a specimen table or mount 1 braced against the pole shoe of an objective lens of an electron microscope, the remaining portions of the lens not being illustrated in the drawing. The specimen table 1 is adjustable transversely by means of push rods (FIG. 3) which are operable from outside the microscope. The specimen table 1 has a centric winding opening 3 for accommodating a receiving ring 4 having a conical bore 5. In the bore 5 is placed a specimen cartridge 6 inserted so as to be parallel to the axis of the electron beam. The specimen cartridge 6 is provided with a central passage 7 through which the electron beam may pass. The specimen cartridge 6 has a conical member or cartridge cone 8 to which is joined a specimen holder 9.

The specimen holder 9 is rotatable about an axis 11 eccentric to the cone axis 10 and is provided with a plurality of openings 12 for receiving a corresponding number of specimens. In the embodiment illustrated in FIG. 1 the object specimen holder 9 is configured as a circular shaped disk and is equipped with openings 12a for receiving special specimen carriers 13. The specimen carriers 13 hold the specimens and are securely positioned by means of a plate 14 held in tension against the specimen holder 9. The fixation of the position of the specimen holder is achieved by a screw 15 which grips into a winding bore 16 of the shaft 17 carrying the specimen holder 9.

The shaft 17 is joined with a gear wheel 18 at a position away from a specimen holder 9. The gear wheel 18 is rotatably held to the end face 20 of the cartridge cone 8 by means of a glide bearing 19. The glide bearing consists of, for example, a ring comprising beryllium-bronze. The ring grips into a ring groove 19a on the gear wheel 18 on the one hand and into a ring groove 19b of a ring 21 constituting a bearing dish on the other hand. The ring 21 is tightly joined with the end face 20 of the cartridge cone 8 via a cap 22.

The cartridge cone 8 and therewith the specimen holder 9 extend into a space 23 surrounded by the pole shoe 2. In this space, there is arranged a cooling apparatus 24 joined to the cooling cap 25.

The gear wheel 18 has a radius which extends beyond the cone axis 10 and is provided with through-openings 27 corresponding to the opening 12 of the circular shaped disk 9 for accommodating the electron beam.

Figure 2:
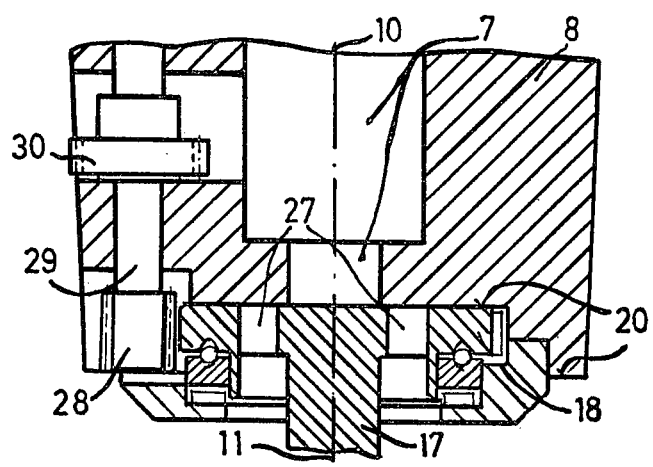
FIG. 2 illustrates a portion of the cartridge in FIG. 1.

As illustrated in FIG. 2, the gear wheel 18 engages the pinion 28 which is on a drive shaft 29 positioned in the cartridge cone 8 parallel to the cone axis 10. The shaft 29 is joined with a toothed drive wheel 30. The wheel 30 has a diameter such that it extends beyond the periphery of the cartridge cone 8 and engages a toothed wheel in the specimen table 1.

Figure 3:
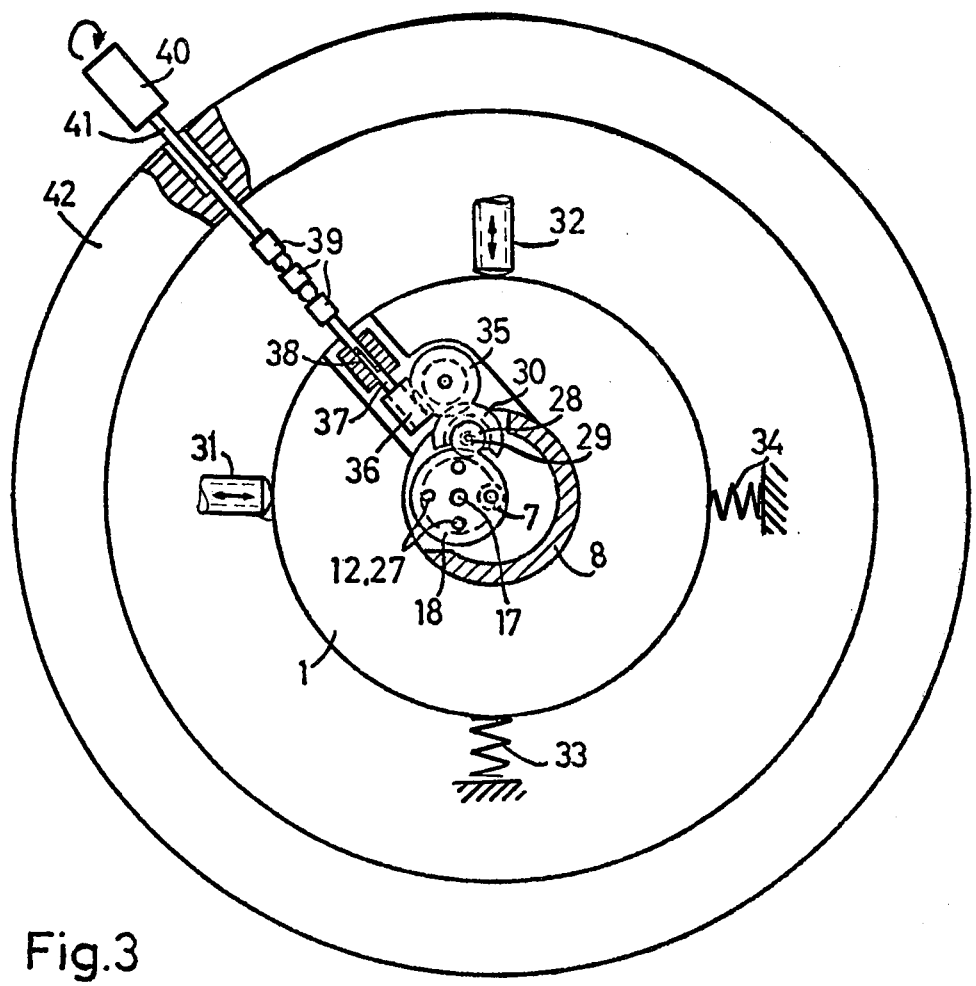
FIG. 3 is a sectional view taken through a particle beam microscope illustrating the position of the specimen cartridge and the drive coupled to the latter and extending to the outside of the microscope.

FIG. 3 illustrates the specimen table 1 which is transversely adjustable by means of push rods 31, 32 and which centrically holds the cartridge cone 8. The toothed drive wheel 30 engages a toothed wheel 35 which is driven by means of a worm gear 36. The worm gear 36 is positioned on a shaft 37 which is joined with a turning wheel or grip 40 via a length adjuster 38 and an angle drive 39. The turning handle 40 is on a shaft 41 which extends vacuum-tight through the housing 42 of the electron microscope. By adjusting the turning handle 40, the specimens are sequentially spaced in the path of the electron beam.

Figure 4:
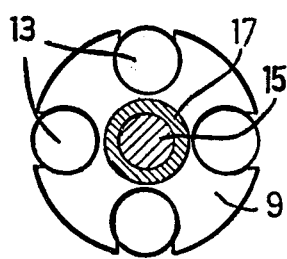
FIG. 4 illustrates one embodiment of a specimen holder in plan view.

FIG. 4 illustrates a disk shaped specimen holder 9 which is configured to receive four specimen carriers 13. This embodiment permits four specimens to be brought into the interior of the electron microscope simultaneously.

Figure 5:
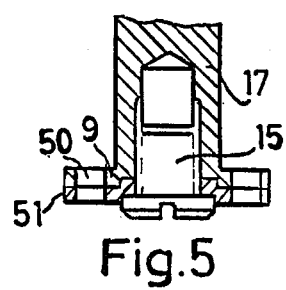
FIG. 5 illustrates, partially in section, another specimen holder corresponding to that in FIG. 1; and, FIG. 6 illustrates in plan view the specimen holder corresponding to that illustrated in FIG. 5.
Figure 6:
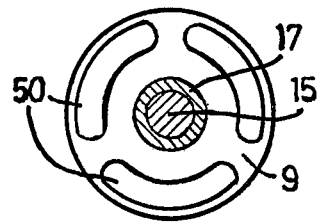

FIG. 5 illustrates the specimen holder 9 of FIG. 1 which has slits extending concentric to the turning axis of the disk as illustrated in FIG. 6. In this embodiment, the specimens are placed between the disk shaped specimen holder 9 and a plate 51 tensioned against the latter. The gear wheel 18 has slit-like pass through openings 27 in this embodiment for passage of the electron beam; this embodiment is especially suited for investigating specimens having a large surface area.

While the invention has been described by means of specific examples and in a specific embodiment, we do not wish to be limited thereto, for obvious modifications will occur to those skilled in the art without departing from the spirit and scope of the invention.

We claim:

1. Specimen cartridge for a particle beam device such as an electron microscope equipped with a specimen mount which is adjustable transversely to the beam axis and into which the cartridge is insertable along an axis parallel to the beam axis, the cartridge comprising a conical member having a longitudinal axis and being mountable on the specimen mount so as to be transversely adjustable therewith, a specimen holder having a plurality of openings for receiving a corresponding number of specimens therein, means for securing said holder to said conical member, and means for rotating said holder about an axis of rotation eccentric to said longitudinal axis so that said openings are selectively alignable with the beam axis.

2. A specimen cartridge according to claim 1, said specimen holder being a circular disk.

3. A specimen cartridge according to claim 2, said specimen holder comprising a plurality of specimen carriers, said openings of said circular disk being dimensioned to accommodate said carriers, and a plate held in tension against said disk for fixedly holding said carriers in said openings.

4. Specimen cartridge according to claim 2, said openings of said circular disk being slits extending concentrically about said rotation axis.

5. A specimen cartridge according to claim 1 wherein said conical member has an end face, said cartridge comprising a gear wheel, a shaft connecting said specimen holder with said gear wheel, and a glide bearing for rotatably supporting said gear wheel on said end face.

6. Specimen cartridge according to claim 5, said gear wheel having a radius extending beyond said longitudinal axis of said conical member and having pass-through openings corresponding to the openings in said specimen holder for permitting passage of the particle beam.

7. Specimen cartridge according to claim 6 comprising a drive assembly including a toothed wheel journalled in the specimen mount, a pinion engaging said gear wheel, a drive shaft connected to said pinion and extending parallel to said longitudinal axis of said conical member, and a toothed drive wheel mounted on said drive shaft, said drive wheel having a diameter extending beyond the periphery of said conical member to permit engagement with said toothed wheel in said specimen table.

* * * * *